United States Patent
Yamamoto et al.

(10) Patent No.: US 11,597,039 B2
(45) Date of Patent: Mar. 7, 2023

(54) WAFER PRODUCING METHOD AND LASER PROCESSING APPARATUS

(71) Applicant: DISCO CORPORATION, Toyo (JP)

(72) Inventors: Ryohei Yamamoto, Tokyo (JP); Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/650,735

(22) Filed: Feb. 11, 2022

(65) Prior Publication Data
US 2022/0161367 A1    May 26, 2022

Related U.S. Application Data

(62) Division of application No. 16/563,282, filed on Sep. 6, 2019, now Pat. No. 11,273,522.

(30) Foreign Application Priority Data

Sep. 14, 2018 (JP) ............................. JP2018-172314

(51) Int. Cl.
| | |
|---|---|
| B23K 26/364 | (2014.01) |
| B28D 5/00 | (2006.01) |
| B24B 1/00 | (2006.01) |
| B23K 26/08 | (2014.01) |
| H01L 21/02 | (2006.01) |
| H01L 21/67 | (2006.01) |
| B23K 103/00 | (2006.01) |

(52) U.S. Cl.
CPC ........ *B23K 26/364* (2015.10); *B23K 26/0853* (2013.01); *B24B 1/00* (2013.01); *B28D 5/0011* (2013.01); *H01L 21/02378* (2013.01); *H01L 21/67092* (2013.01); *B23K 2103/52* (2018.08); *B28D 5/0094* (2013.01)

(58) Field of Classification Search
CPC ............ B23K 26/0853; B23K 2103/52; B28D 5/0011; H01L 21/02378
See application file for complete search history.

(56) References Cited

U.S. PATENT DOCUMENTS

| | | | | |
|---|---|---|---|---|
| 10,611,052 B1 * | 4/2020 | Bubel | ............... | B28D 5/0011 |
| 2017/0291254 A1 * | 10/2017 | Hirata | ............... | B28D 5/0011 |
| 2017/0291255 A1 * | 10/2017 | Hirata | ............... | C30B 33/04 |
| 2018/0154543 A1 | 6/2018 | Hirata | | |

(Continued)

FOREIGN PATENT DOCUMENTS

| | | |
|---|---|---|
| JP | 2000094221 A | 4/2000 |
| JP | 2016111143 A | 6/2016 |

*Primary Examiner* — Binh X Tran
(74) *Attorney, Agent, or Firm* — Greer Burns & Crain Ltd.

(57) ABSTRACT

A wafer producing apparatus detects a facet area from an upper surface of an SiC ingot, sets X and Y coordinates of plural points lying on a boundary between the facet area and a nonfacet area in an XY plane, and sets a focal point of a laser beam having a transmission wavelength to SiC inside the SiC ingot at a predetermined depth from the upper surface of the SiC ingot. The predetermined depth corresponds to the thickness of the SiC wafer to be produced. A control unit increases the energy of the laser beam and raises a position of the focal point in applying the laser beam to the facet area as compared with the energy of the laser beam and a position of the focal point in applying the laser beam to the nonfacet area, according to the X and Y coordinates.

1 Claim, 5 Drawing Sheets

(56) References Cited

U.S. PATENT DOCUMENTS

| | | | |
|---|---|---|---|
| 2018/0214976 A1* | 8/2018 | Iizuka | B23K 26/53 |
| 2018/0254223 A1 | 9/2018 | Hirata et al. | |
| 2018/0308679 A1 | 10/2018 | Hirata | |
| 2019/0006212 A1 | 1/2019 | Iizuka et al. | |
| 2019/0030651 A1 | 1/2019 | Sekiya | |
| 2020/0150038 A1* | 5/2020 | Ito | G01N 21/6489 |
| 2020/0211850 A1* | 7/2020 | Donofrio | H01L 21/2007 |
| 2020/0391327 A1* | 12/2020 | Yamamoto | G01N 21/9505 |

* cited by examiner

FIG.3
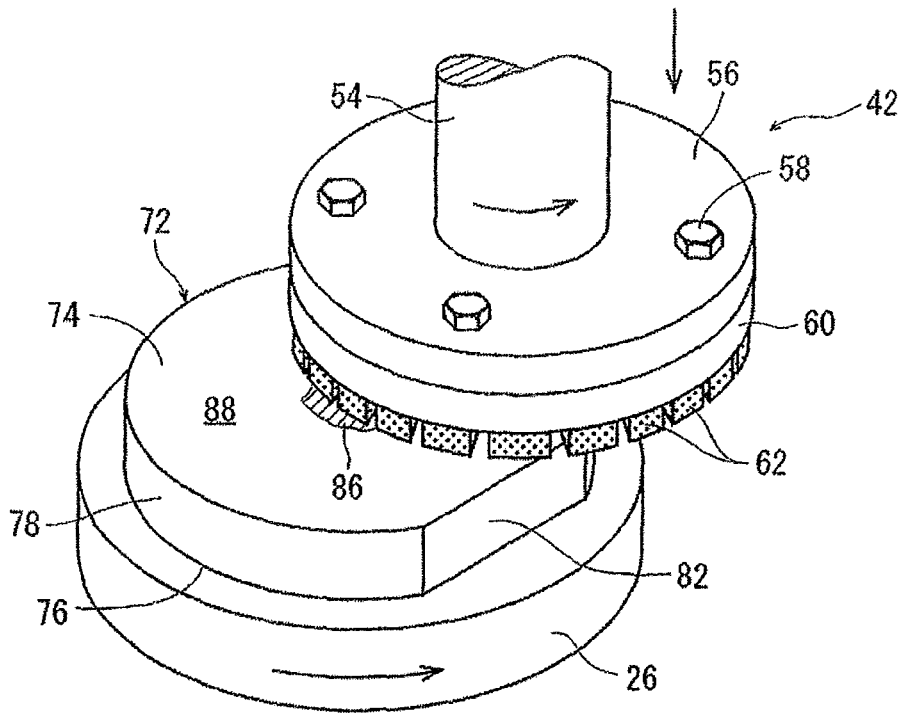
FIG.4A
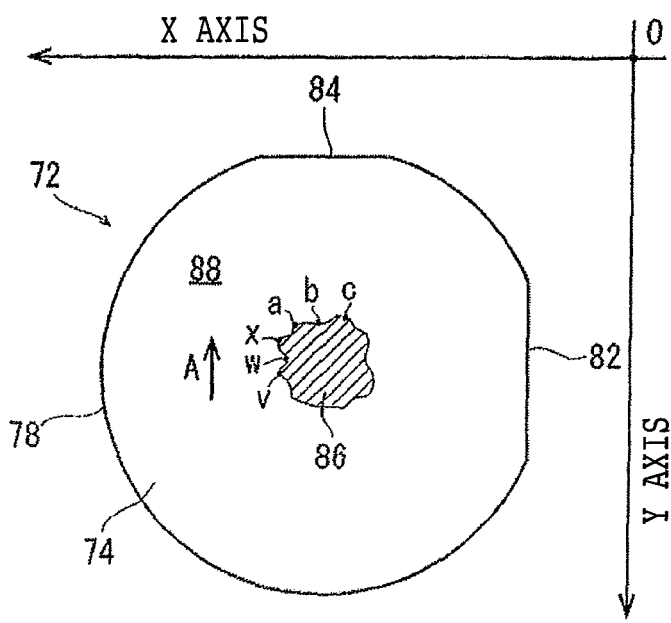
FIG.4B
|   | COORDINATES |
|---|---|
| a | $x_1, y_1$ |
| b | $x_2, y_2$ |
| c | $x_3, y_3$ |
| v | $x_{22}, y_{22}$ |
| w | $x_{23}, y_{23}$ |
| x | $x_{24}, y_{24}$ |

WAFER PRODUCING METHOD AND LASER PROCESSING APPARATUS

This is a divisional application of application Ser. No. 16/563,282, filed Sep. 6, 2019, which claims the benefit of Japanese Patent Application No. 2018-172314, filed Sep. 14, 2018.

BACKGROUND OF THE INVENTION

Field of the Invention

The present invention relates to a wafer producing method for producing a silicon carbide (SiC) wafer from an SiC ingot and also relates to a laser processing apparatus for forming a separation layer inside an SiC ingot.

Description of the Related Art

Various devices such as integrated circuits (ICs), large scale integrated circuits (LSIs), and light emitting diodes (LEDs) are formed by forming a functional layer on the front side of a wafer formed of silicon (Si) or sapphire ($Al_2O_3$) and partitioning this functional layer into a plurality of separate regions along a plurality of division lines. Further, power devices or optical devices such as LEDs are formed by forming a functional layer on the front side of a wafer formed of hexagonal single-crystal SiC and partitioning this functional layer into a plurality of separate regions along a plurality of division lines. The division lines of such a wafer having these devices are processed by a processing apparatus such as a cutting apparatus and a laser processing apparatus to thereby divide the wafer into a plurality of individual device chips respectively corresponding to the devices. The device chips thus obtained are used in various electrical equipment such as mobile phones and personal computers.

In general, the wafer on which the devices are to be formed is produced by slicing a cylindrical ingot with a wire saw. Both sides of the wafer sliced from the ingot are polished to a mirror finish (see Japanese Patent Laid-Open No. 2000-94221, for example). However, when the ingot is cut by the wire saw and both sides of each wafer are polished to obtain the product, a large proportion (70% to 80%) of the ingot is discarded to cause a problem of poor economy. In particular, an SiC ingot has high hardness and it is therefore difficult to cut this ingot with the wire saw. Accordingly, considerable time is required for cutting of the ingot, causing a reduction in productivity. Furthermore, since this ingot is high in unit price, there is a problem in efficiently producing a wafer in this prior art.

A technique for solving this problem has been proposed (see Japanese Patent Laid-Open No. 2016-111143, for example). This technique includes the steps of setting the focal point of a laser beam having a transmission wavelength to hexagonal single-crystal SiC inside an SiC ingot, next applying the laser beam to the SiC ingot as scanning the laser beam on the SiC ingot to thereby form separation layers in a separation plane previously set inside the SiC ingot, and next breaking the SiC ingot along the separation plane where the separation layers have been formed, thus separating an SiC wafer from the SiC ingot.

SUMMARY OF THE INVENTION

However, there is a case that a facet area different in crystal structure from a nonfacet area exists in the SiC ingot. The refractive index in the facet area is higher than that in the nonfacet area, and the absorptivity of energy in the facet area is also higher than that in the nonfacet area. Accordingly, the depth and condition of the separation layer to be formed in the facet area may become different from those of the separation layer to be formed in the nonfacet area in applying the laser beam to the SiC ingot. As a result, there is a problem such that a step may be formed between the separation layer in the facet area and the separation layer in the nonfacet area. Further, to grind the wafer produced from the SiC ingot to thereby obtain a desired wafer thickness, the thickness of the wafer to be produced must be increased in consideration of the step between the facet area and the nonfacet area. Accordingly, the efficiency of production is insufficient.

It is therefore an object of the present invention to provide a wafer producing method which can produce an SiC wafer from an SiC ingot in the condition where no step is present in the separation layer between the facet area and the nonfacet area.

It is another object of the present invention to provide a laser processing apparatus for use in performing this wafer producing method.

In accordance with an aspect of the present invention, there is provided a wafer producing method for producing an SiC wafer from an SiC ingot having an upper surface and a lower surface opposite to the upper surface, the wafer producing method including: a flat surface forming step of grinding the upper surface of the SiC ingot to thereby form a flat surface; a coordinates setting step of detecting a facet area from the upper surface of the SiC ingot and also setting the X and Y coordinates of plural points lying on a boundary between the facet area and a nonfacet area in a condition where an X axis extends in a direction perpendicular to a direction of formation of an off angle defined as an angle of inclination of a c-plane with respect to the upper surface of the SiC ingot, and a Y axis extends in a direction perpendicular to the X axis, after performing the flat surface forming step; a feeding step of setting a focal point of a laser beam having a transmission wavelength to SiC inside the SiC ingot at a predetermined depth from the upper surface of the SiC ingot, the predetermined depth corresponding to a thickness of the SiC wafer to be produced, next applying the laser beam from focusing means included in a laser processing apparatus to the SiC ingot, and relatively moving the SiC ingot and the focal point in an X direction parallel to the X axis, after performing the coordinates setting step, thereby forming a belt-shaped separation layer extending in the X direction inside the SiC ingot, the separation layer being composed of a modified portion where SiC is decomposed into Si and carbon (C) and a plurality of cracks extending from the modified portion along the c-plane; an indexing step of relatively moving the SiC ingot and the focal point in a Y direction parallel to the Y axis, after performing the feeding step, thereby forming a plurality of belt-shaped separation layers arranged side by side in the Y direction; and a separating step of separating the SiC wafer from the SiC ingot along a planar separation layer composed of the plurality of belt-shaped separation layers, after performing the feeding step and the indexing step; in which in the feeding step, energy of the laser beam is increased and a position of the focusing means is raised in applying the laser beam to the facet area as compared with energy of the laser beam and a position of the focusing means in applying the laser beam to the nonfacet area, according to the X and Y coordinates set in the coordinates setting step.

In accordance with another aspect of the present invention, there is provided a laser processing apparatus for forming a separation layer inside an SiC ingot having an upper surface and a lower surface opposite to the upper surface, the laser processing apparatus including a holding table for holding the SiC ingot in a condition where the upper surface of the SiC ingot is oriented upward; facet area detecting means detecting a facet area from the upper surface of the SiC ingot held on the holding table; coordinates setting means setting and recording X and Y coordinates of plural points lying on a boundary between the facet area and a nonfacet area in a condition where an X axis extends in a direction perpendicular to a direction of formation of an off angle defined as an angle of inclination of a c-plane with respect to the upper surface of the SiC ingot, and a Y axis extends in a direction perpendicular to the X axis; a laser beam applying unit having focusing means applying a laser beam to the SiC ingot in a condition where a focal point of the laser beam is set inside the SiC ingot at a predetermined depth from the upper surface of the SiC ingot, the predetermined depth corresponding to a thickness of an SiC wafer to be produced from the SiC ingot, the laser beam having a transmission wavelength to SiC, thereby forming a separation layer inside the SiC ingot, the separation layer being composed of a modified portion where SiC is decomposed into Si and carbon (C) and a plurality of cracks extending from the modified portion along the c-plane; an X moving mechanism for relatively moving the holding table and the focusing means in an X direction parallel to the X axis; a Y moving mechanism for relatively moving the holding table and the focusing means in a Y direction parallel to the Y axis; and a control unit increasing energy of the laser beam and raising a position of the focusing means in applying the laser beam to the facet area as compared with energy of the laser beam and a position of the focusing means in applying the laser beam to the nonfacet area, according to the X and Y coordinates set by the coordinates setting means.

According to the wafer producing method of the present invention, the depth and condition of the planar separation layer to be formed in the facet area can be made equal to those of the planar separation layer to be formed in the nonfacet area. Accordingly, the SiC wafer can be produced in the condition where no step is present in the planar separation layer between the facet area and the nonfacet area.

According to the laser processing apparatus of the present invention, the depth and condition of the planar separation layer to be formed in the facet area can be made equal to those of the planar separation layer to be formed in the nonfacet area in applying the laser beam to the SiC ingot. Accordingly, the SiC wafer can be produced in the condition where no step is present in the planar separation layer between the facet area and the nonfacet area.

The above and other objects, features, and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 3 is a perspective view depicting a flat surface forming step in a wafer producing method using the laser processing apparatus depicted in FIG. 1;

FIG. 4A is a schematic view depicting an image of the SiC ingot as detected in a coordinates setting step in the wafer producing method;

FIG. 4B is a table depicting the X and Y coordinates of plural points lying on the boundary between a facet area and a nonfacet area as set in the coordinates setting step;

DETAILED DESCRIPTION OF THE PREFERRED EMBODIMENT

Figure 1:
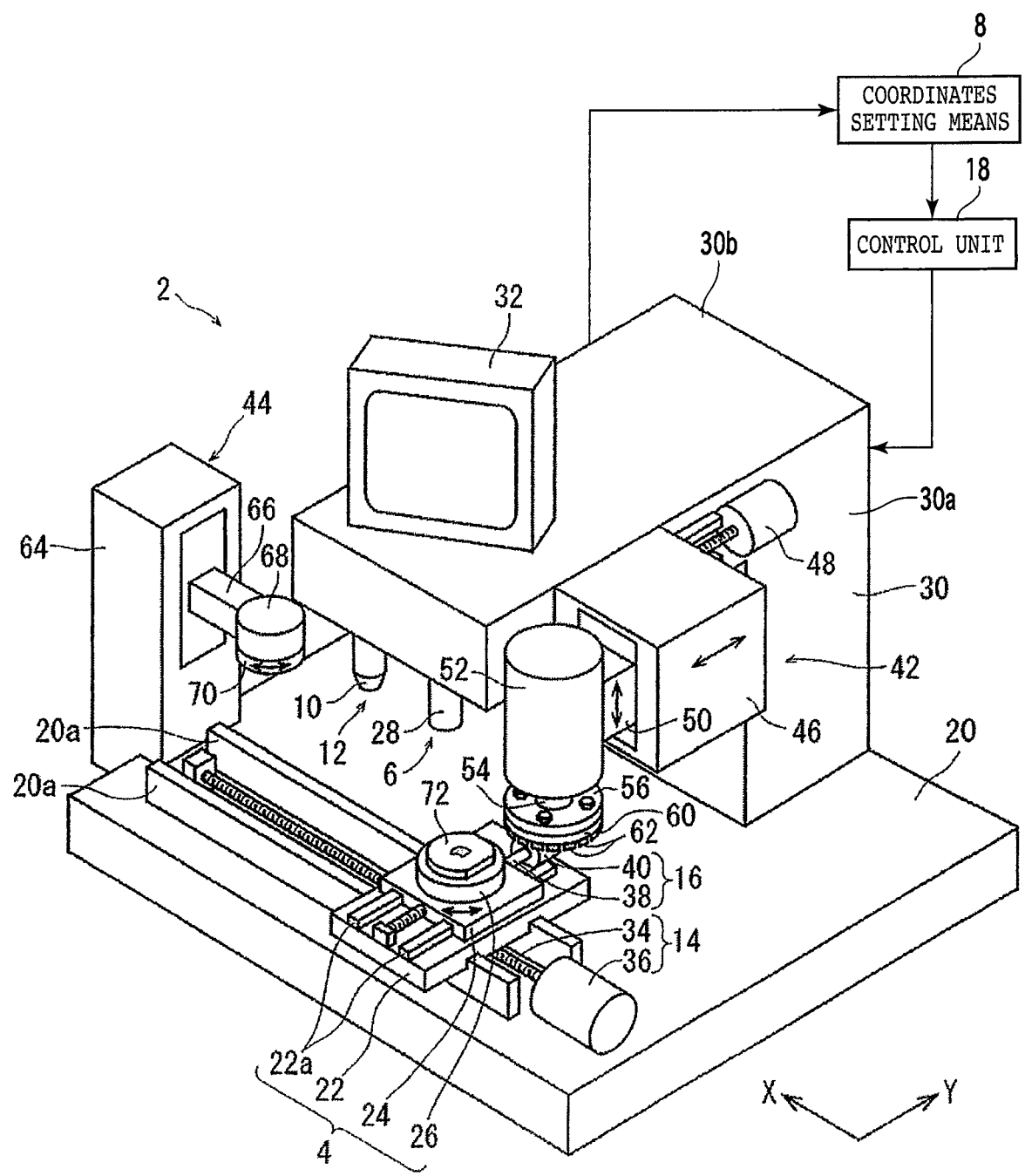
FIG. 1 is a perspective view of a laser processing apparatus according to a preferred embodiment of the present invention.

A preferred embodiment of the wafer producing method and the laser processing apparatus according to the present invention will now be described with reference to the drawings. FIG. 1 generally depicts a laser processing apparatus 2 according to this preferred embodiment. As depicted in FIG. 1, the laser processing apparatus 2 includes a holding unit 4 for holding an SiC ingot 72, facet area detecting means 6 for detecting a facet area from the upper surface of the SiC ingot 72, and coordinate setting means 8 for setting and recording the X and Y coordinates of plural points lying on the boundary between the facet area and a nonfacet area. The laser processing apparatus 2 further includes a laser beam applying unit 12 having focusing means 10 for applying a laser beam to the SiC ingot 72 in the condition where the focal point of the laser beam is set inside the SiC ingot 72 at a predetermined depth from the upper surface of the SiC ingot 72, the predetermined depth corresponding to the thickness of a wafer to be produced, the laser beam having a transmission wavelength to SiC, thereby forming a separation layer inside the SiC ingot 72, the separation layer being composed of a modified portion where SiC is decomposed into Si and C and a plurality of cracks extending from the modified portion along a c-plane. The laser processing apparatus 2 further includes an X moving mechanism 14 for relatively moving the holding unit 4 and the focusing means 10 in the X direction (feeding direction) depicted by an arrow X in FIG. 1, a Y moving mechanism 16 for relatively moving the holding unit 4 and the focusing means 10 in the Y direction (indexing direction) depicted by an arrow Y in FIG. 1, and a control unit 18 for controlling the operation of the laser processing apparatus 2. The X direction and the Y direction are perpendicular to each other in an XY plane. The XY plane defined by the X direction and the Y direction is a substantially horizontal plane.

The laser processing apparatus 2 further includes a base 20, and the holding unit 4 includes an X movable plate 22 mounted on the base 20 so as to be movable in the X direction, a Y movable plate 24 mounted on the X movable plate 22 so as to be movable in the Y direction, a holding table 26 rotatably mounted on the upper surface of the Y movable plate 24, and a motor (not depicted) for rotating the holding table 26.

The facet area detecting means 6 has an imaging unit 28 for imaging the upper surface of the SiC ingot 72 held on the holding table 26. As depicted in FIG. 1, an inverted L-shaped support member 30 is mounted on the upper surface of the base 20. The support member 30 is composed of a vertical portion 30a extending upward from the upper surface of the base 20 and a horizontal portion 30b extending horizontally from the upper end of the vertical portion 30a. The imaging unit 28 is mounted on the lower surface of the horizontal portion 30b at its front end portion. Further, a display unit 32 for displaying an image obtained by the imaging unit 28 is provided on the upper surface of the horizontal portion 30b. Preferably, the facet area detecting means 6 has image processing means for performing image processing such as binarization processing to the image of the SiC ingot 72 as obtained by the imaging unit 28. Preferably, the imaging unit 28 of the facet area detecting means 6 serves also as an imaging unit for use in performing alignment before applying a laser beam to the SiC ingot 72.

The coordinates setting means 8 are electrically connected to the imaging unit 28. According to the image of the SiC ingot 72 as obtained by the imaging unit 28, the coordinates setting means 8 functions to set and record the X and Y coordinates of plural points lying on the boundary between the facet area and the nonfacet area in the condition where an X axis extends in the direction perpendicular to a direction of formation of an off angle defined as an angle of inclination of the c-plane with respect to the upper surface of the SiC ingot 72, and a Y axis extends in the direction perpendicular to the X axis. The direction of extension of the X axis is substantially the same as the X direction depicted in FIG. 1, and the direction of extension of the Y axis is substantially the same as the Y direction depicted in FIG. 1.

The focusing means or condenser 10 of the laser beam applying unit 12 is mounted on the lower surface of the horizontal portion 30b at its front end portion so as to be spaced from the imaging unit 28 in the X direction. The laser beam applying unit 12 further includes a laser oscillator (not depicted) for generating a pulsed laser beam having a transmission wavelength to SiC, an attenuator (not depicted) for adjusting the power of the pulsed laser beam generated from the laser oscillator, and focal position adjusting means (not depicted) for vertically moving the focusing means 10 to thereby adjust the vertical position of the focal point of the pulsed laser beam. The focal position adjusting means may be configured by a ball screw connected to the focusing means 10 so as to extend vertically and a motor for rotating this ball screw. In the operation of the laser beam applying unit 12, a pulsed laser beam is generated from the laser oscillator and next adjusted in power by the attenuator. Thereafter, the pulsed laser beam is focused by the focusing means 10 and applied to the SiC ingot 72 held on the holding table 26 of the holding unit 4.

The X moving mechanism 14 has a ball screw 34 connected to the X movable plate 22 so as to extend in the X direction and a motor 36 connected to one end of the ball screw 34 for rotating the ball screw 34. Accordingly, a rotary motion of the motor 36 is converted into a linear motion by the ball screw 34, and this linear motion is transmitted to the X movable plate 22, so that the X movable plate 22 can be moved relative to the focusing means 10 in the X direction along a pair of parallel guide rails 20a provided on the base 20. That is, the X movable plate 22 is slidably mounted on the guide rails 20a extending in the X direction.

Similarly, the Y moving mechanism 16 has a ball screw 38 connected to the Y movable plate 24 so as to extend in the Y direction and a motor 40 connected to one end of the ball screw 38 for rotating the ball screw 38. Accordingly, a rotary motion of the motor 40 is converted into a linear motion by the ball screw 38, and this linear motion is transmitted to the Y movable plate 24, so that the Y movable plate 24 can be moved relative to the focusing means 10 in the Y direction along a pair of parallel guide rails 22a provided on the X movable plate 22. That is, the Y movable plate 24 is slidably mounted on the guide rails 22a extending in the Y direction.

The control unit 18 is electrically connected to the coordinates setting means 8. According to the X and Y coordinates of plural points lying on the boundary between the facet area and the nonfacet area as set by the coordinates setting means 8, the control unit 18 functions to increase the energy of the laser beam and raise the position of the focusing means 10 in applying the laser beam to the facet area as compared with the energy of the laser beam and the position of the focusing means 10 in applying the laser beam to the nonfacet area. The control unit 18, the image processing means of the facet area detecting means 6, and the coordinates setting means 8 may be configured by separate computers or by a common computer.

The laser processing apparatus 2 further includes a grinding unit 42 for grinding the upper surface of the SiC ingot 72 held on the holding table 26 and a separating mechanism 44 for separating the wafer from the SiC ingot 72 held on the holding table 26 after forming the separation layer inside the SiC ingot 72.

The grinding unit 42 includes a casing 46 mounted on the side surface of the horizontal portion 30b of the support member 30 so as to be movable in the Y direction, casing moving means 48 for moving the casing 46 in the Y direction, an arm 50 having a base end vertically movably supported to the casing 46 and extending in the Y direction from the base end, arm elevating means (not depicted) for vertically moving the arm 50, and a spindle housing 52 mounted on the front end of the arm 50.

A vertically extending spindle 54 is rotatably supported to the spindle housing 52, and a motor (not depicted) for rotating the spindle 54 is built in the spindle housing 52. Referring to FIG. 3, a disk-shaped wheel mount 56 is fixed to the lower end of the spindle 54, and an annular grinding wheel 60 is fixed to the lower surface of the wheel mount 56 by bolts 58. A plurality of abrasive members 62 are fixed to the lower surface of the grinding wheel 60 so as to be annularly arranged at given intervals along the outer circumference of the grinding wheel 60.

Referring back to FIG. 1, the separating mechanism 44 includes a casing 64 provided near the left ends of the guide rails 20a on the base 20 as viewed in FIG. 1, an arm 66 having a base end vertically movably supported to the casing 64 and extending in the X direction from the base end, and arm elevating means (not depicted) for vertically moving the arm 66. A motor 68 is connected to the front end of the arm 66, and a suction member 70 is connected to the lower surface of the motor 68 so as to be rotatable about a vertical axis thereof. A plurality of suction holes (not depicted) are formed on the lower surface of the suction member 70. These suction holes of the suction member 70 are connected to suction means (not depicted) for producing a vacuum. Further, the suction member 70 contains ultrasonic vibration applying means (not depicted) for applying ultrasonic vibration to the lower surface of the suction member 70.

Figure 2A:
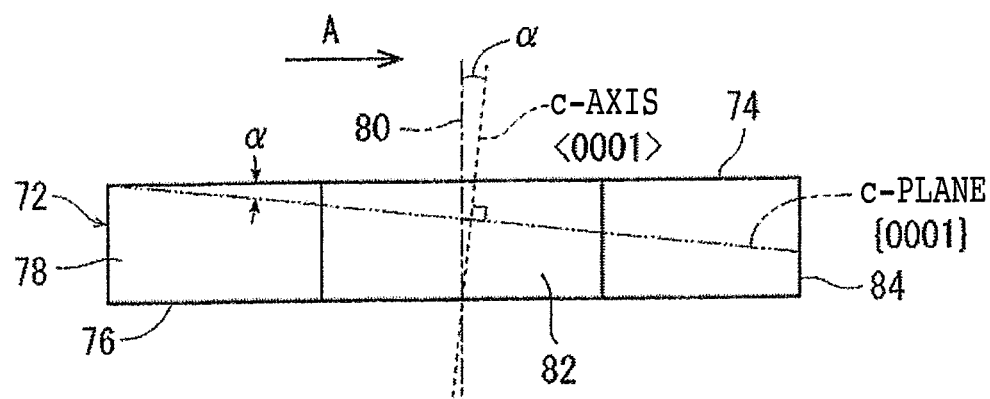
FIG. 2A is an elevational view of an SiC ingot.
Figure 2B:
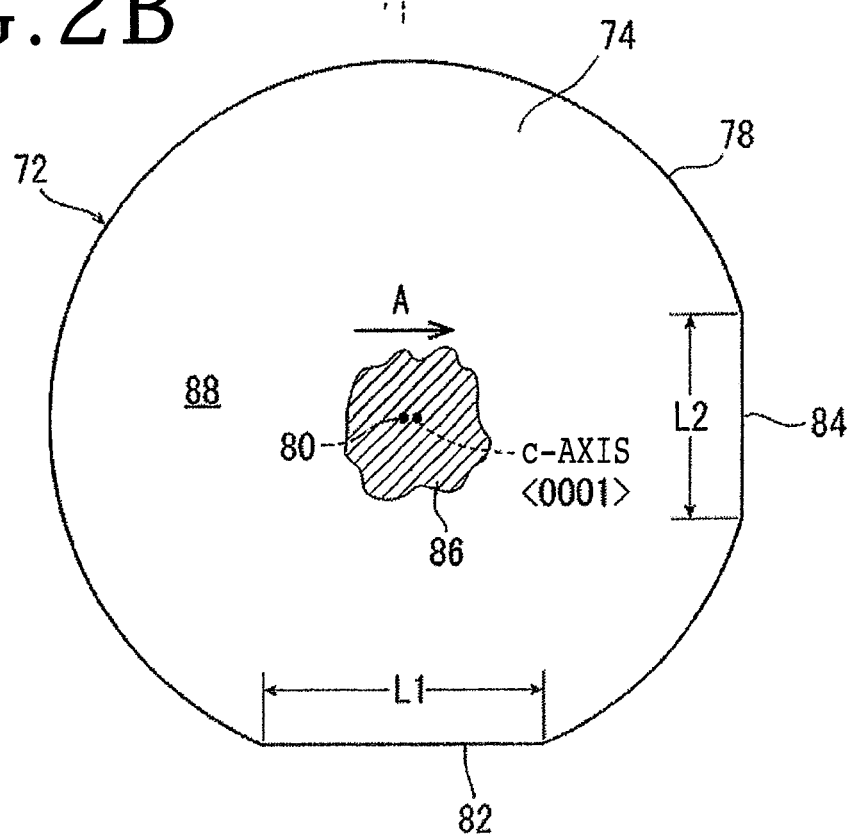
FIG. 2B is a plan view of the SiC ingot depicted in FIG. 2A.

FIGS. 2A and 2B depict the SiC ingot 72, which is formed of SiC. The SiC ingot 72 has a substantially cylindrical shape. That is, the SiC ingot 72 has a substantially circular first end surface 74, a substantially circular second end surface 76 opposite to the first end surface 74, a substantially cylindrical surface 78 formed so as to connect the first end surface 74 and the second end surface 76, a c-axis (<0001> direction) extending from the first end surface 74 to the second end surface 76, and a c-plane ({0001} plane) perpendicular to the c-axis.

In the SiC ingot 72, the c-axis is inclined by an off angle α (e.g., α=1, 3, or 6 degrees) with respect to a normal 80 to the first end surface 74. The off angle α is formed between the c-plane and the first end surface 74. The direction of formation of the off angle α (i.e., the direction of inclination of the c-axis) is depicted by an arrow A in FIGS. 2A and 2B. Further, the cylindrical surface 78 of the SiC ingot 72 is formed with a first orientation flat 82 and a second orientation flat 84, which are rectangular as viewed in side elevation and function to indicate crystal orientation. The first orientation flat 82 is parallel to the direction A of formation of the off angle α, and the second orientation flat 84 is perpendicular to the direction A of formation of the off angle α. As depicted in FIG. 2B, which is a plan view taken in the direction of extension of the normal 80, the length L2 of the second orientation flat 84 is set shorter than the length L1 of the first orientation flat 82 (L2<L1).

The SiC ingot 72 is mainly formed of hexagonal single-crystal SiC, and a facet area 86 different in crystal structure is locally present in the SiC ingot 72 as depicted in FIG. 2B. A nonfacet area other than the facet area 86 is denoted by reference numeral 88. That is, the crystal structure in the facet area 86 is different from that in the nonfacet area 88.

The preferred embodiment of the wafer producing method according to the present invention will now be described. In this preferred embodiment, the laser processing apparatus 2 mentioned above is used to perform the wafer producing method. First, the SiC ingot 72 is fixed to the upper surface of the holding table 26 by using a suitable adhesive (e.g., epoxy resin adhesive) in the condition where the first end surface 74 of the SiC ingot 72 is oriented upward. That is, the adhesive is interposed between the second end surface 76 of the SiC ingot 72 and the upper surface of the holding table 26. As a modification, a plurality of suction holes may be formed on the upper surface of the holding table 26, and a suction force may be applied through these suction holes to the upper surface of the holding table 26, thereby holding the SiC ingot 72 on the upper surface of the holding table 26.

After fixing the SiC ingot 72 to the upper surface of the holding table 26 as mentioned above, a flat surface forming step is performed to flatten the upper surface of the SiC ingot 72 by grinding, except the case that the upper surface of the SiC ingot 72 has already been flattened.

In performing the flat surface forming step, the holding table 26 holding the SiC ingot 72 is moved to the position below the grinding unit 42. Thereafter, as depicted in FIG. 3, the holding table 26 is rotated at a predetermined speed (e.g., 300 rpm) in a counterclockwise direction as viewed in plan. Further, the spindle 54 is also rotated at a predetermined speed (e.g., 6000 rpm) in a counterclockwise direction as viewed in plan. Thereafter, the arm 50 is lowered by operating the arm elevating means to thereby bring the abrasive members 62 into contact with the upper surface of the SiC ingot 72 (i.e., the first end surface 74 of the SiC ingot 72 in this preferred embodiment). Thereafter, the arm 50 is further lowered at a predetermined feed speed (e.g., 0.1 μm/s) to thereby grind the upper surface of the SiC ingot 72. Accordingly, the upper surface of the SiC ingot 72 is flattened to such a degree that the incidence of a laser beam on the upper surface of the SiC ingot 72 is not hindered in a separation layer forming step to be performed later. Thus, the upper surface of the SiC ingot 72 is ground to become a flat surface.

After performing the flat surface forming step, a coordinates setting step is performed to detect the facet area 86 from the upper surface of the SiC ingot 72 and set the X and Y coordinates of plural points lying on the boundary between the facet area 86 and the nonfacet area 88 in the condition where an X axis extends in the direction perpendicular to a direction of formation of an off angle α defined as an angle of inclination of the c-plane with respect to the upper surface of the SiC ingot 72, and a Y axis extends in the direction perpendicular to the X axis.

In performing the coordinates setting step, the holding table 26 holding the SiC ingot 72 is first moved to the position below the imaging unit 28. Thereafter, the imaging unit 28 is operated to image the upper surface of the SiC ingot 72. According to an image of the SiC ingot 72 as detected by the imaging unit 28 or according to an image obtained by performing image processing such as binarization processing to the above image of the SiC ingot 72, the facet area 86 is detected. Thereafter, as depicted in FIGS. 4A and 4B, the coordinates setting means 8 is operated to set and record the X and Y coordinates of plural points (e.g., 24 points from a point a to a point x lying on the boundary between the facet area 86 and the nonfacet area 88 in the condition where the X axis extends in the direction perpendicular to the direction of formation of the off angle α and the Y axis extends in the direction perpendicular to the X axis. Furthermore, the X and Y coordinates of plural points lying on the outer edge of the SiC ingot 72 are also set and recorded. Thereafter, the X and Y coordinates in the facet area 86 and the X and Y coordinates in the nonfacet area 88 are set and recorded according to the X and Y coordinates of the plural points lying on the boundary between the facet area 86 and the nonfacet area 88 and according to the X and Y coordinates of the plural points lying on the outer edge of the SiC ingot 72.

After performing the coordinates setting step, a feeding step is performed by setting the focal point of a laser beam having a transmission wavelength to SiC inside the SiC ingot 72 at a predetermined depth from the upper surface of the SiC ingot 72, the predetermined depth corresponding to the thickness of a wafer to be produced, next applying the laser beam from the focusing means 10 of the laser processing apparatus 2 to the SiC ingot 72, and relatively moving the SiC ingot 72 and the focal point in the X direction, thereby forming a belt-shaped separation layer extending in the X direction inside the SiC ingot 72, the separation layer being composed of a modified portion where SiC is decomposed into Si and C and a plurality of cracks extending from the modified portion along the c-plane.

In performing the feeding step, the holding table 26 holding the SiC ingot 72 is first moved in the X direction and in the Y direction according to the image of the SiC ingot 72 as obtained by the imaging unit 28 in the coordinates setting step, thereby adjusting the positional relation between the SiC ingot 72 and the focusing means 10 in the XY plane.

Figure 5A:
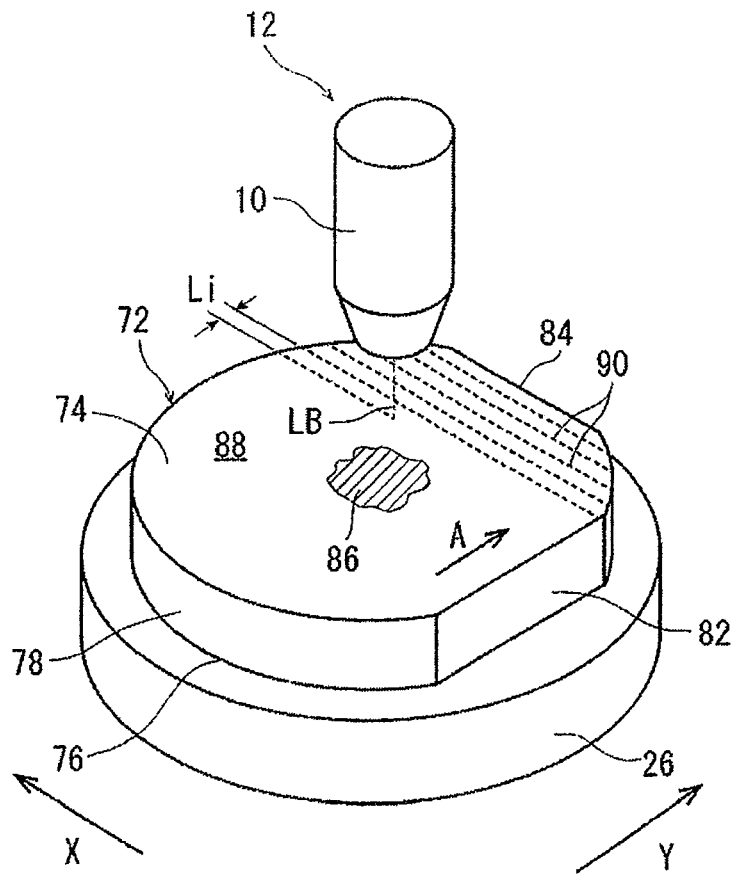
FIG. 5A is a perspective view depicting a feeding step in the wafer producing method.
Figure 5B:
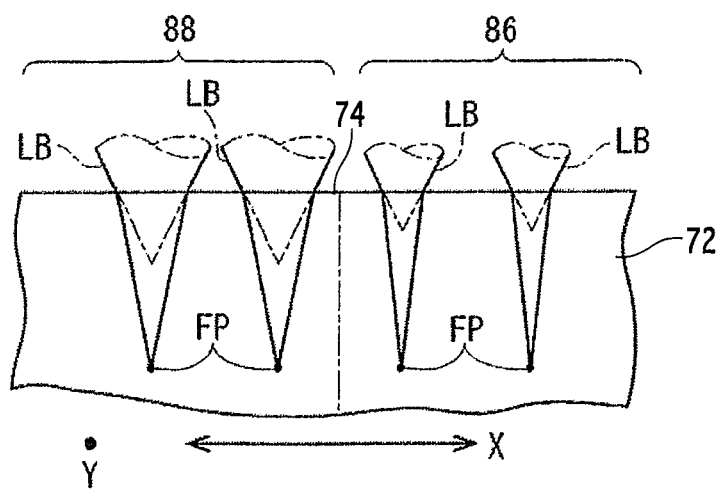
FIG. 5B is a sectional view depicting the feeding step.
Figure 6:
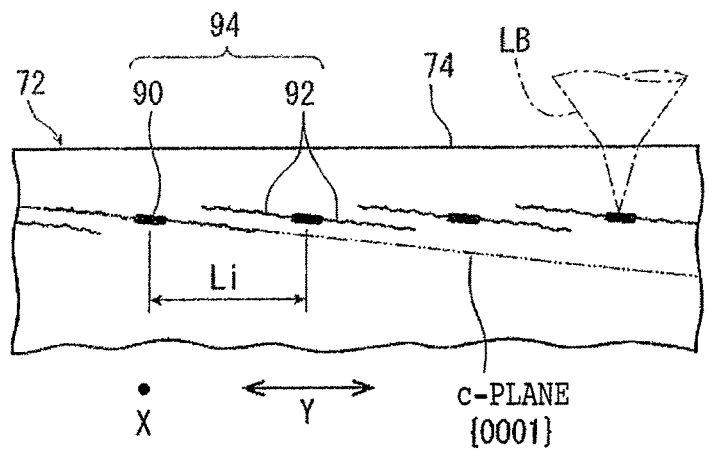
FIG. 6 is a sectional view depicting an indexing step in the wafer producing method.

Thereafter, the focusing means 10 is vertically moved by operating the focal position adjusting means to thereby set a focal point FP (see FIG. 5B) inside the SiC ingot 72 in the nonfacet area 88 at a predetermined depth from the upper surface of the SiC ingot 72, in which the predetermined depth corresponds to the thickness of a wafer to be produced. Thereafter, a pulsed laser beam LB having a transmission wavelength to SiC is applied from the focusing means 10 to the SiC ingot 72 as moving the holding table 26 at a predetermined feed speed in the X direction coinciding with the direction perpendicular to the direction A of formation of the off angle α. More specifically, the pulsed laser beam LB is initially applied to the SiC ingot 72 to thereby decompose SiC into Si and C. Thereafter, the pulsed laser beam LB is next applied to the SiC ingot 72 and absorbed by C previously produced. Thus, SiC is decomposed into Si and C in a chain reaction manner with the movement of the holding table 26 in the X direction to thereby linearly form a modified portion 90 extending in the X direction as depicted in FIG. 6. At the same time, a plurality of cracks 92 are also formed so as to isotropically extend from the modified portion 90 along the c-plane as depicted in FIG. 6. As a result, a belt-shaped separation layer 94 composed of the modified portion 90 and the cracks 92 is formed inside the SiC ingot 72 so as to extend in the X direction as depicted in FIG. 6.

In this feeding step, according to the X and Y coordinates set in the coordinates setting step, the control unit 18 controls the laser beam applying unit 12 so as to increase the energy of the pulsed laser beam LB and raise the position of the focusing means 10 in applying the pulsed laser beam LB to the facet area 86 as compared with the energy of the pulsed laser beam LB and the position of the focusing means 10 in applying the pulsed laser beam LB to the nonfacet area 88. The refractive index in the facet area 86 is higher than that in the nonfacet area 88. Accordingly, by controlling the laser beam applying unit 12 as mentioned above, the depth of the focal point FP in the facet area 86 can be made substantially equal to the depth of the focal point FP in the nonfacet area 88 as depicted in FIG. 5B. As a result, the depth of the separation layer 94 to be formed in the facet area 86 can be made substantially equal to the depth of the separation layer 94 to be formed in the nonfacet area 88. Further, the absorptivity of energy in the facet area 86 is also higher than that in the nonfacet area 88. Accordingly, by making the energy of the pulsed laser beam LB to be applied to the facet area 86 higher than the energy of the pulsed laser beam LB to be applied to the nonfacet area 88, the condition of the separation layer 94 to be formed in the facet area 86 can be made equal to the condition of the separation layer 94 to be formed in the nonfacet area 88.

This feeding step may be performed under the following processing conditions, in which the word of "defocus" means the amount of movement of the focusing means 10 toward the lower surface 76 of the SiC ingot 72 from the condition where the focal point FP of the pulsed laser beam LB is set on the upper surface 74 of the SiC ingot 72.
(Nonfacet area: refractive index=2.65)
 Wavelength of the pulsed laser beam: 1064 nm
 Average power: 7 W
 Repetition frequency: 30 kHz
 Pulse width: 3 ns
 Feed speed: 165 mm/s
 Defocus: 188 µm
 Depth of the separation layer from the upper surface of the SiC ingot: 500 µm
(Facet area: refractive index=2.79)
 Wavelength of the pulsed laser beam: 1064 nm
 Average power: 9.1 W
 Repetition frequency: 30 kHz
 Pulse width: 3 ns
 Feed speed: 165 mm/s
 Defocus: 179 µm
 Depth of the separation layer from the upper surface of the SiC ingot: 500 µm After performing the feeding step, an indexing step is performed to relatively move the SiC ingot 72 and the focal point FP in the Y direction, thereby forming a plurality of belt-shaped separation layers 94 arranged side by side in the Y direction. In this preferred embodiment, the SiC ingot 72 is moved in the Y direction relative to the focal point FP by a predetermined index amount Li (see FIGS. 5A and 6), and the above feeding step is repeated. As a result, another belt-shaped separation layer 94 extending in the X direction is formed adjacent to the previous belt-shaped separation layer 94 in the Y direction. By repeating the feeding step and the indexing step, a plurality of similar belt-shaped separation layers 94 can be formed inside the SiC ingot 72 at the predetermined depth over the entire upper surface of the SiC ingot 72. The predetermined index amount Li is set to a value less than the value twice the length of each crack 92, so that the cracks 92 of any adjacent ones of the plural belt-shaped separation layers 94 arranged in the Y direction can be overlapped with each other as viewed in plan. Accordingly, the wafer can be easily separated from the SiC ingot 72 in a separating step to be performed later.

Figure 7:
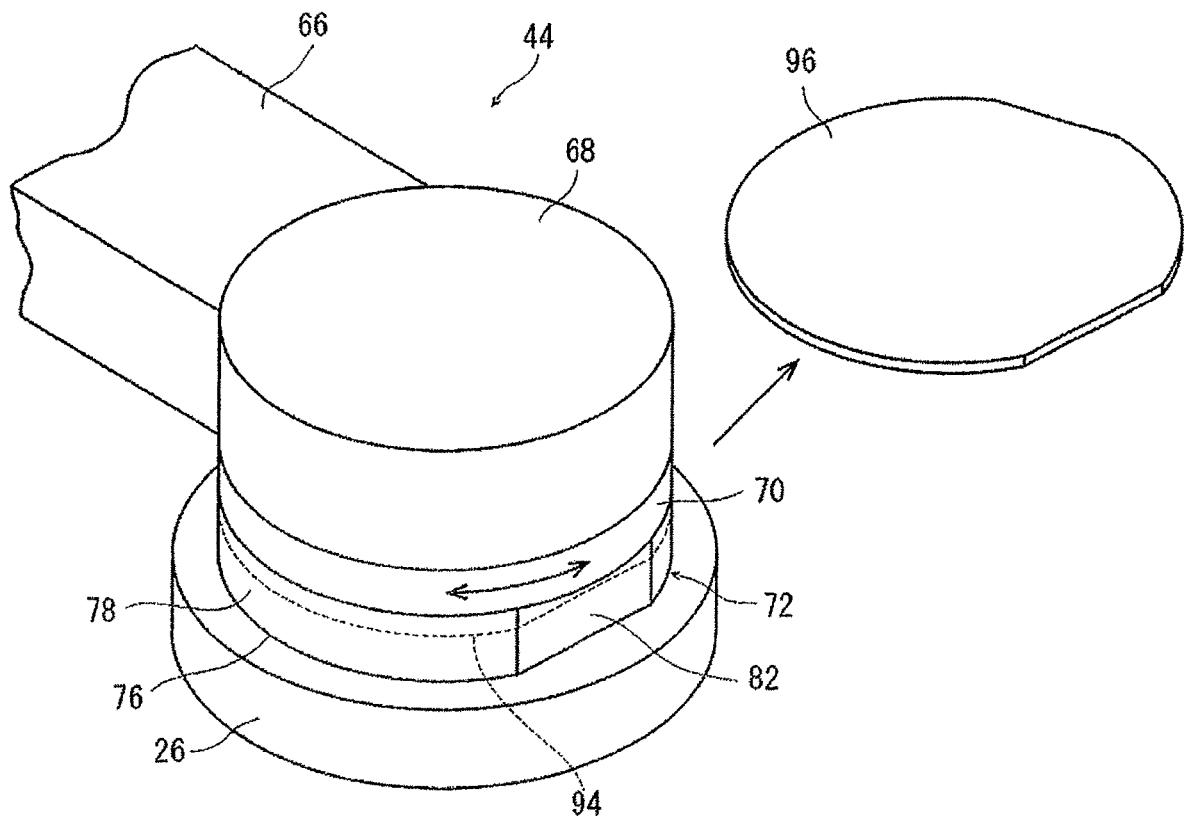
FIG. 7 is a perspective view depicting a separating step in the wafer producing method.

After performing the feeding step and the indexing step constituting a separation layer forming step to thereby form the plural belt-shaped separation layers 94 inside the SiC ingot 72 at the predetermined depth, a separating step is performed to separate a wafer from the SiC ingot 72 along a planar separation layer composed of the plural belt-shaped separation layers 94. In performing the separating step, the holding table 26 holding the SiC ingot 72 is moved to the position below the suction member 70 of the separating mechanism 44. Thereafter, the arm 66 is lowered by operating the arm elevating means to thereby bring the lower surface of the suction member 70 into close contact with the first end surface 74 of the SiC ingot 72 as depicted in FIG. 7. Thereafter, the suction means is operated to attract the first end surface 74 of the SiC ingot 72 to the lower surface of the suction member 70 under suction. Thereafter, the ultrasonic vibration applying means is operated to apply ultrasonic vibration to the lower surface of the suction member 70. At the same time, the motor 68 is operated to rotate the suction member 70. As a result, an SiC wafer 96 can be separated from the SiC ingot 72 along the planar separation layer composed of the plural belt-shaped separation layers 94. Thus, the SiC wafer 96 is a wafer to be produced from the SiC ingot 72.

After separating the SiC wafer 96 from the SiC ingot 72, the flat surface forming step may be performed to the separation surface (upper surface) of the SiC ingot 72 (the remaining SiC ingot). Thereafter, the feeding step, the indexing step, and the separating step may be similarly repeated to thereby produce a plurality of similar SiC wafers 96 from the SiC ingot 72. The facet area 86 is formed so as to extend from the upper surface of the SiC ingot 72 to the lower surface thereof and have the same shape along the thickness of the SiC ingot 72 like a Japanese Kintaro bar candy such that the same Kintaro's face appears at any axial position where the bar candy is cut. Accordingly, the coordinates setting step must be performed only in producing the first SiC wafer 96 from the SiC ingot 72, and it is unnecessary to perform the coordinates setting step in producing the second and subsequent SiC wafers 96 from the remaining SiC ingot 72.

According to the above preferred embodiment, the depth and condition of the planar separation layer composed of the plural belt-shaped separation layers 94 to be formed in the facet area 86 can be made equal to those of the planar separation layer to be formed in the nonfacet area 88. Accordingly, the SiC wafer 96 can be produced in the condition where no step is present in the planar separation layer between the facet area 86 and the nonfacet area 88. That is, it is unnecessary to separate the SiC wafer 96 with the thickness thereof increased in consideration of the step between the facet area 86 and the nonfacet area 88, so that the efficiency of production can be improved.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus for forming a separation layer inside an SiC ingot having an upper surface and a lower surface opposite to said upper surface, said laser processing apparatus comprising:

a holding table for holding said SiC ingot in a condition where the upper surface of said SiC ingot is oriented upward;

facet area detecting means detecting a facet area from the upper surface of said SiC ingot held on said holding table;

coordinates setting means setting and recording X and Y coordinates of plural points lying on a boundary between said facet area and a nonfacet area in a condition where an X axis extends in a direction perpendicular to a direction of formation of an off angle defined as an angle of inclination of a c-plane with respect to the upper surface of said SiC ingot, and a Y axis extends in a direction perpendicular to said X axis;

a laser beam applying unit having focusing means applying a laser beam to said SiC ingot in a condition where a focal point of said laser beam is set inside said SiC ingot at a predetermined depth from the upper surface of said SiC ingot, said predetermined depth corresponding to a thickness of an SiC wafer to be produced from said SiC ingot, said laser beam having a transmission wavelength to SiC, thereby forming a separation layer inside said SiC ingot, said separation layer being composed of a modified portion where SiC is decomposed into Si and C and a plurality of cracks extending from said modified portion along said c-plane;

an X moving mechanism for relatively moving said holding table and said focusing means in an X direction parallel to said X axis;

a Y moving mechanism for relatively moving said holding table and said focusing means in a Y direction parallel to said Y axis; and a control unit increasing energy of said laser beam and raising a position of said focusing means in applying said laser beam to said facet area as compared with energy of said laser beam and a position of said focusing means in applying said laser beam to said nonfacet area, according to the X and Y coordinates set by said coordinates setting means.

* * * * *